(12) United States Patent
Whitten

(10) Patent No.: US 9,172,366 B2
(45) Date of Patent: Oct. 27, 2015

(54) COLLECTOR CURRENT DRIVER FOR A BIPOLAR JUNCTION TRANSISTOR TEMPERATURE TRANSDUCER

(71) Applicant: Lattice Semiconductor Corporation, Hillsboro, OR (US)

(72) Inventor: Trent Whitten, Portland, OR (US)

(73) Assignee: Lattice Semiconductor Corporation, Portland, OR (US)

( * ) Notice: Subject to any disclaimer, the term of this patent is extended or adjusted under 35 U.S.C. 154(b) by 94 days.

(21) Appl. No.: 14/172,678

(22) Filed: Feb. 4, 2014

(65) Prior Publication Data
US 2015/0222258 A1 Aug. 6, 2015

(51) Int. Cl.
*H01L 35/00* (2006.01)
*H03K 17/14* (2006.01)
*H03K 17/60* (2006.01)

(52) U.S. Cl.
CPC ............. *H03K 17/14* (2013.01); *H03K 17/60* (2013.01)

(58) Field of Classification Search
None
See application file for complete search history.

(56) References Cited

U.S. PATENT DOCUMENTS

| | | | |
|---|---|---|---|
| 6,118,327 A * | 9/2000 | Watarai | 327/513 |
| 6,160,305 A | 12/2000 | Sanchez | |
| 6,554,469 B1 | 4/2003 | Thomson et al. | |
| 7,170,334 B2 * | 1/2007 | Miranda et al. | 327/512 |
| 7,332,952 B2 | 2/2008 | McLeod et al. | |
| 7,461,974 B1 | 12/2008 | Aslan et al. | |
| 7,915,947 B2 | 3/2011 | Liu et al. | |
| 7,965,129 B1 * | 6/2011 | Wadhwa et al. | 327/513 |
| 8,044,702 B2 | 10/2011 | Niederberger | |
| 8,096,707 B2 | 1/2012 | Raychowdhury et al. | |
| 8,308,358 B2 | 11/2012 | Doorenbos | |

OTHER PUBLICATIONS

Pertijis, Michiel A., et al., A CMOS Smart Temperature Sensor With a 3σ, Inaccruracy of ±0.1°C From—55°C to 125°C, IEEE Journal of Solid-State Circuits, Dec. 2005, pp. 2805-2815, vol. 40, No. 12, IEEE Journal of Solid-State Circuits.

* cited by examiner

*Primary Examiner* — An Luu (57) ABSTRACT

In one embodiment, a collector current driver is provided that controls the collector current for a bipolar transistor temperature transducer. The collector current driver is configured to use negative feedback to generate an emitter current for the bipolar transistor responsive to target current.

20 Claims, 7 Drawing Sheets

COLLECTOR CURRENT DRIVER FOR A BIPOLAR JUNCTION TRANSISTOR TEMPERATURE TRANSDUCER

TECHNICAL FIELD

The present invention relates generally to integrated circuits, and more particularly to an integrated circuit adapted to control the collector current of a bipolar junction transistor.

BACKGROUND

PNP bipolar transistors are readily produced in CMOS integrated circuits as parasitic substrate devices. This is quite advantageous as bipolar transistors have an emitter-to-base voltage (Veb) that varies predictably with regard to temperature. The temperature of integrated circuits may thus be monitored using a bipolar transistor as a temperature transducer. Because a bipolar transistor is readily and inexpensively embedded with the circuits to be monitored, bipolar transistor temperature transducers are attractive options to an integrated circuit designer.

Although bipolar transistor temperature transducers are inexpensive, they suffer from a number of problems. For example, it is known that if the collector current for a bipolar transistor is changed from a first collector current value IC1 to a second collector current value IC2, a resulting change in emitter-to-base voltage (ΔVeb) is directly proportional to a product of the absolute temperature T and the logarithm of a ratio of the collector currents (IC2/IC1). If IC2 equals N*IC1, then the temperature is proportional to ΔVeb divided by the logarithm of N. This logarithm of N may be stored in a memory such that the temperature measurement merely requires mapping ΔVeb by some proportionality factor retrieved from the memory. The accuracy of the temperature measurement thus is a function of the accuracy for the collector current ratio. But the collector current IC for a PNP bipolar transistor temperature transducer is commonly determined from the emitter current IE. In particular, IC equals IE*(β/β+1), where β is a current gain factor that depends upon the collector current amplitude. A ratio of emitter currents will thus vary from the desired ratio of collector currents as a function of this variation in β. For high values of β, this dependence of the emitter current ratio on the variation in β leads to relatively little error. For example, a PNP bipolar transistor temperature transducer having a 10% variation for a β of 100 leads to just a 0.1° C. error as the collector current is increased tenfold. Such a relatively high value of β is readily achieved in discrete PNP transistors. But integrated PNP transistors typically have much lower values of β such as one or even less than one. In contrast to the high-β example, a PNP bipolar transistor temperature transducer having a 10% variation for a β of 1 leads to a 6° C. error as the collector current is increased tenfold.

To mitigate temperature measurement errors from β variation as a function of collector current, a lead may be used to monitor the collector current of the PNP device directly. While such a solution is feasible for discrete PNP devices, an integrated PNP device does not have a discrete collector terminal since its substrate serves as the collector terminal. Direct monitoring of the collector current for integrated PNP devices would thus be expensive and cumbersome because of the need for an additional pin on the transducer package and a corresponding trace on the package's printed circuit board.

Accordingly, there is a need in the art for an integrated bipolar transistor temperature transducer that compensates for the variation in β.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Overview

A collector current driver is provided that maintains a bipolar transistor's collector current ($I_C$) at a target value despite temperature and β variations. The collector current driver includes a current source that drives a target collector current into a first current mirror such that the first current mirror replicates the target collector current in a first current path. As used herein, a replicated or duplicate current of a source or reference current is said to be equal to the reference or source current. But it will be appreciated that such an equality is not perfect in that there are always slight inaccuracies in any circuit attempting to duplicate an analog parameter such as a current. Thus, when one current is denoted herein to equal (or be proportional) to another current, it will be understood that the equality or proportionality of the currents defined herein are subject to real-world circuit tolerances and errors. The first current path includes a first load so that the duplicated target collector current produces a first voltage with regard to a resistance of the first load. A second current path is configured to conduct a duplicate of a difference current. The second current path includes a second load so that the duplicate of the difference current produces a second voltage with regard to a resistance of the second load.

A differential amplifier amplifies a feedback voltage responsive to a difference between the first and second voltages. The differential amplifier drives the feedback voltage onto a gate of an output transistor that sources an emitter current ($I_E$) for the bipolar transistor (the transducer). The differential amplifier also drives a gate of a first duplicate output transistor with the feedback voltage. The first duplicate output transistor is matched to the output transistor and drives a current into a second current mirror responsive to the feedback voltage. Both the output transistor and the first duplicate transistor have their sources tied to a power supply node. Since the duplicate output transistor thus has the same source voltage and the same gate voltage as the output transistor and also is matched to the output transistor, the first duplicate transistor drives a duplicate of the emitter transducer current into the second current mirror.

In addition, the differential amplifier drives a gate of a second duplicate output transistor with the feedback voltage. In response to the feedback voltage, the second duplicate output transistor drives a current into a feedback current path. Just like the first duplicate output transistor, the second duplicate output transistor also has its source coupled to the power supply node. If the second duplicate output transistor were also matched to the output transistor, the current driven into the feedback current path would equal $I_E$. But the second duplicate output transistor is twice as large as the output transistor such that the second duplicate output transistor drives twice the emitter current ($2I_E$) through the feedback current path.

Although the differential amplifier thus controls the emitter current, the collector current driver needs to relate this control of the emitter current to the collector current, which equals the emitter current minus a base current ($I_B$) for the transducer. To do so, the second current mirror includes a sum current transistor that receives the base current as well as the emitter duplicate current from the first duplicate output transistor. The sum current transistor thus conducts a sum current equaling a sum of the transducer base current ($I_B$) and the emitter duplicate current ($I_E$). The second current mirror also includes a first mirror transistor, which is configured to conduct a duplicate of the sum current driven into the sum current transistor.

The feedback current path sources the duplicate sum current conducted through the first mirror transistor. In addition, the feedback current path sources a current to a difference transistor in a third current mirror. The difference transistor thus conducts a difference current that equals a current conducted in the feedback current path minus the duplicate sum current driven into the first mirror transistor. Recall that the differential amplifier controls the current conducted through the feedback current path to equal $2I_E$. Thus, the difference current equals $2I_E$ minus the duplicate sum current such that the difference current equals $I_C$.

In addition to the difference transistor, the third current mirror includes a second mirror transistor configured to conduct a duplicate of the difference current. The second mirror transistor couples between the second current path and ground such that the current conducted through the second current path equals the duplicate of the difference current. But as discussed above, the difference current equals $I_C$ such that the negative feedback (as supplied through the negative feedback voltage) from the differential amplifier controls $I_C$ to equal the target current. These concepts and features may be better understood with regard to the following example embodiment.

Example Embodiment

Figure 1:
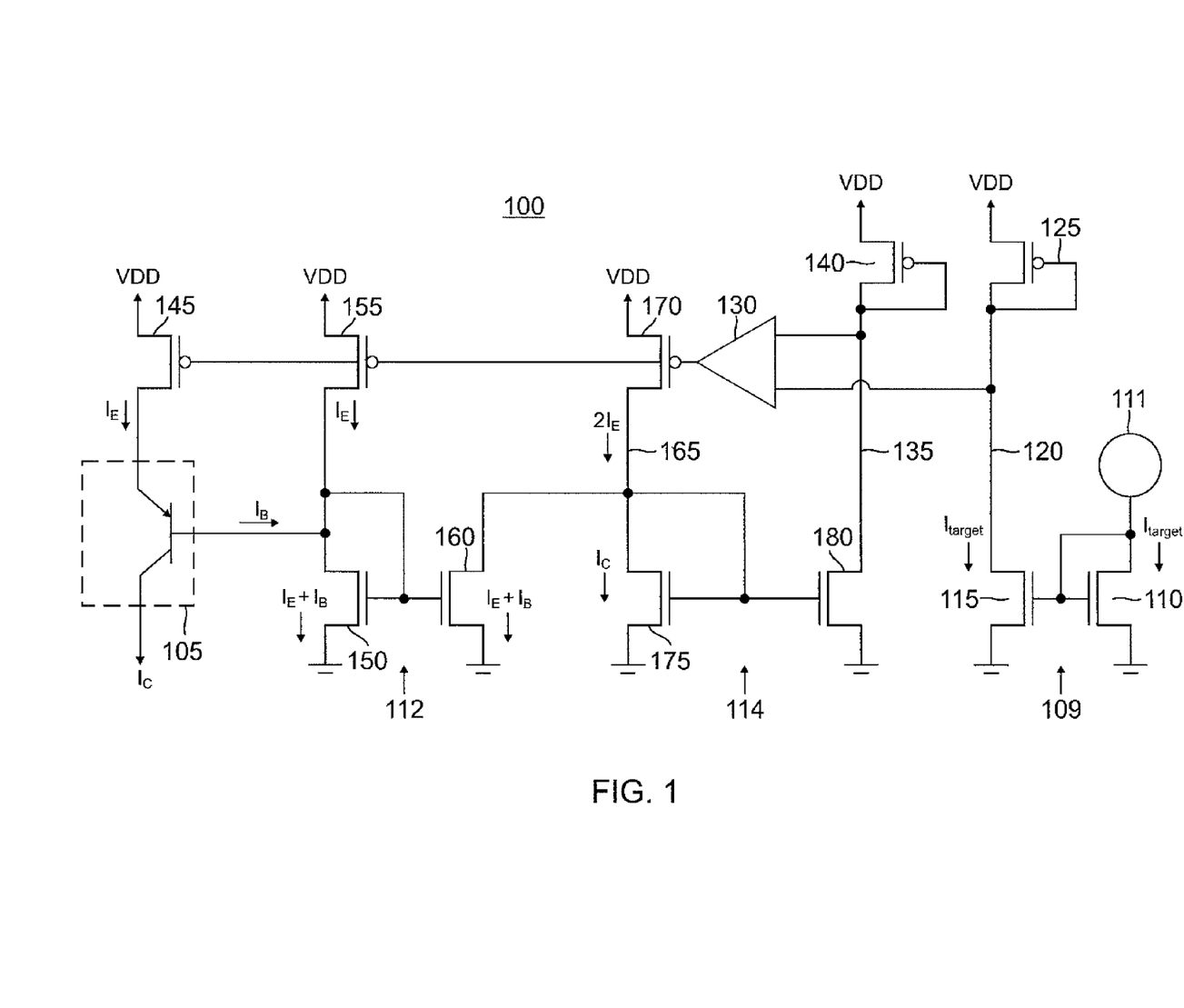
FIG. 1 is a schematic diagram of a bipolar transistor temperature transducer and an associated collector current driver in accordance with an embodiment of the disclosure.

Turning now to the drawings, FIG. 1 illustrates an example collector current driver 100 for a PNP bipolar transistor temperature transducer 105. A current source 111 drives a target collector current target ($I_{target}$) through an NMOS transistor 110 in a first current mirror 109 that also includes an NMOS transistor 115. A drain and gate of NMOS transistor 110 are coupled in a current mirror configuration to a gate of NMOS transistor 115 such that NMOS transistor 115 is configured to conduct a duplicate of $I_{target}$ into ground. A first current path 120 supplies $I_{target}$ to a drain of NMOS transistor 115. First current path 120 includes a first load such as a diode-connected PMOS transistor 125 having its source coupled to a power supply node supplying a power supply voltage VDD and a drain coupled to a drain of NMOS transistor 115. The drain of PMOS transistor 115 also couples to a first input node for a differential amplifier 130. A resulting voltage at the drain of PMOS transistor 125 equaling VDD minus the source-to-gate voltage of PMOS transistor 125 induced by $I_{target}$ thus drives the first input of differential amplifier 130.

A second load such as a diode-connected PMOS transistor 140 also has its source coupled to the power supply node and a drain coupled to a second current path 134. The drain of PMOS transistor 140 couples to a second input node for differential amplifier 130. Based upon the current driven through second current path 135 a voltage thus develops at the drain of diode-connected PMOS transistor 140 that drives the second input to differential amplifier 130. As will be discussed further herein, a negative feedback from differential amplifier 130 controls the current conducted through second current path 135 such that second current path 135 also conducts a duplicate of $I_{target}$. The following discussion will show that collector current driver 100 is configured to make a collector current $I_C$ for transducer 105 also equal $I_{target}$ regardless of variations in the transducer's β.

To make $I_C$ equal $I_{target}$, differential amplifier 130 drives the gates of three transistors including an output PMOS transistor 145 with a feedback voltage responsive to an amplification of a difference between its two input voltages as produced at the drains of transistors 140 and 125. Output transistor 145 has its source coupled to the power supply node and a drain coupled to the emitter of transducer 105. Output transistor 145 thus sources an emitter current $I_E$ to transducer 105 responsive to the negative feedback voltage from differential amplifier 130. As known in the differential amplifier arts, negative feedback from a differential amplifier such as differential amplifier 130 functions to keep its input voltages equal. The negative feedback from differential amplifier 130 thus keeps the currents in first current path 120 and second current path 135 equal. This same negative feedback thus also controls $I_E$ through output transistor 145.

Differential amplifier 130 also drives a gate of a first duplicate output PMOS transistor 155 with the feedback voltage. First duplicate output transistor 155 has the same size as output transistor 145. In addition, first duplicate output transistor 155 has the same source voltage as output transistor 145 since a source for first duplicate output transistor is coupled to the power supply node. First duplicate output transistor 155 is thus matched to output transistor 145 in that it has the same gate-to-source voltage and has the same size. Accordingly, a drain current for first duplicate output transistor 155 equals $I_E$. The drain of first duplicate output transistor 155 couples to a drain of a sum current NMOS transistor 150 in a second current mirror 112. A base terminal for transducer 105 is also coupled to the drain of sum current transistor 150. A base current $I_B$ from transducer 105 thus drives the drain of sum current transistor 150 that also receives the $I_E$ duplicate current from first duplicate output PMOS transistor 155. A drain of sum current transistor 155 that is coupled to ground thus sinks a sum current equaling a sum of $I_E$ and $I_B$ into ground.

Second current mirror 112 also includes a mirror NMOS transistor 160 that has its source tied to ground. Sum current transistor 150 has its drain and gate tied to a gate of a mirror transistor 160. Second current mirror 112 is thus configured such that mirror transistor 160 sinks a duplicate of the sum current into ground. A feedback current path 165 couples to a drain of mirror transistor 160. With regard to a current conducted through feedback current path 165, differential amplifier 130 drives a gate of a second duplicate output PMOS transistor 170 with the feedback voltage. A source of second duplicate output transistor 170 couples to the power supply node whereas its drain couples to feedback current path 165. If second duplicate output transistor 170 was the same width as output transistor 145, it would thus be matched to output transistor 145 as discussed earlier for first duplicate output transistor 155. But second duplicate output PMOS transistor 170 is configured to be twice the size of output transistor 145. In that regard, double duplicate output transistor 170 may comprise a single transistor of twice the size of output transistor 145 or a pair of duplicate output transistors coupled in parallel between the power supply node and feedback current path 165. Regardless of whether second duplicate output PMOS transistor 170 comprises a plural or single transistor, its gate and source voltages are the same as those for output transistor 145. Second duplicate output transistor 170 will thus conduct twice the emitter current ($2I_E$) into feedback current path 165.

Feedback current path 165 also provides a drain current to a difference NMOS transistor 175 that has its source coupled to ground. Difference NMOS transistor 175 is part of a third current mirror 114 that also includes a mirror NMOS transistor 180. Since the current in feedback current path 165 is divided between the drains of mirror transistor 160 and difference transistor 175, a difference current conducted through difference transistor 175 equals the difference between $2I_E$ and the sum current ($I_E+I_B$). The difference current conducted through difference transistor 175 into ground thus equals $I_C$. Difference transistor 175 and mirror transistor 160 thus form a difference circuit configured to subtract a sum current equaling a sum of $I_E$ and $I_B$ from a current equaling $2I_E$ to provide a difference current. Because first current mirror 109 mirrors a duplicate of the difference current, it is also referred to herein as a "difference current mirror."

The drain and gate of difference transistor 175 both couple to a gate of mirror transistor 180. Third current mirror 114 is thus configured such that mirror transistor 180 conducts a duplicate of $I_C$ (or equivalently, a duplicate of the difference current). Mirror transistor 180 has its source coupled to ground and a drain tied to second current path 135. Such a configuration is quite advantageous because $I_C$ is then forced to equal $I_{target}$ regardless of the β value for PNP bipolar transistor transducer 105. For example, suppose $I_C$ conducting through second current path 135 does not equal $I_{target}$ conducting through first current path 120. That means that the voltages at the drains of PMOS transistors 140 and 125 will be unequal. In response, the negative feedback from differential amplifier 130 is such that amplifier 130 drives its three transistors 145, 155, and 170 to change $I_E$ sufficiently so that $I_C$ equals $I_{target}$.

Because the temperature measurement using transducer 105 uses a ratio of collector currents, collector current driver 100 needs some means for varying the collector current. For example, current source 111 driving transistor 110 in first current mirror 109 could be configured to vary its target current. But the changing currents in collector current driver 100 may then lead to less than optimal biasing of the transistors in collector current driver 100 and corresponding measurement errors. An advantageous alternative embodiment uses arrays of transistors arranged in parallel such as shown for first current mirror 109 in FIG. 2A. To better appreciate the parallel-transistor technique for varying collector current, current mirror operation will be briefly reviewed. If transistors 110 and 115 are matched in first current mirror 109 of FIG. 1, the current mirrored into first current path 120 will match the target current driven into transistor 110 by current source 111. But if, for example, transistor 115 has $1/10^{th}$ the size of transistor 110, then the current mirrored into first current path 120 by first current mirror 109 will just equal $1/10^{th}$ of the target current from current source 111 (assuming all remaining parameters such as doping were matched). Transistors 110 and 115 are thus instantiated in FIG. 2A by two sets of M transistors each, where M is a plural integer. In this fashion, transistor 110 is instantiated using M NMOS transistors 210 all arranged in parallel between current source 111 and ground. Similarly, transistor 115 is instantiated using M NMOS transistors 215 also arranged in parallel between transistor 140 and ground. The gates and drains of transistors 210 are tied to the gates of transistors 215 to complete first current mirror 109. Transistors 210 and 215 are all matched.

Figure 2A:
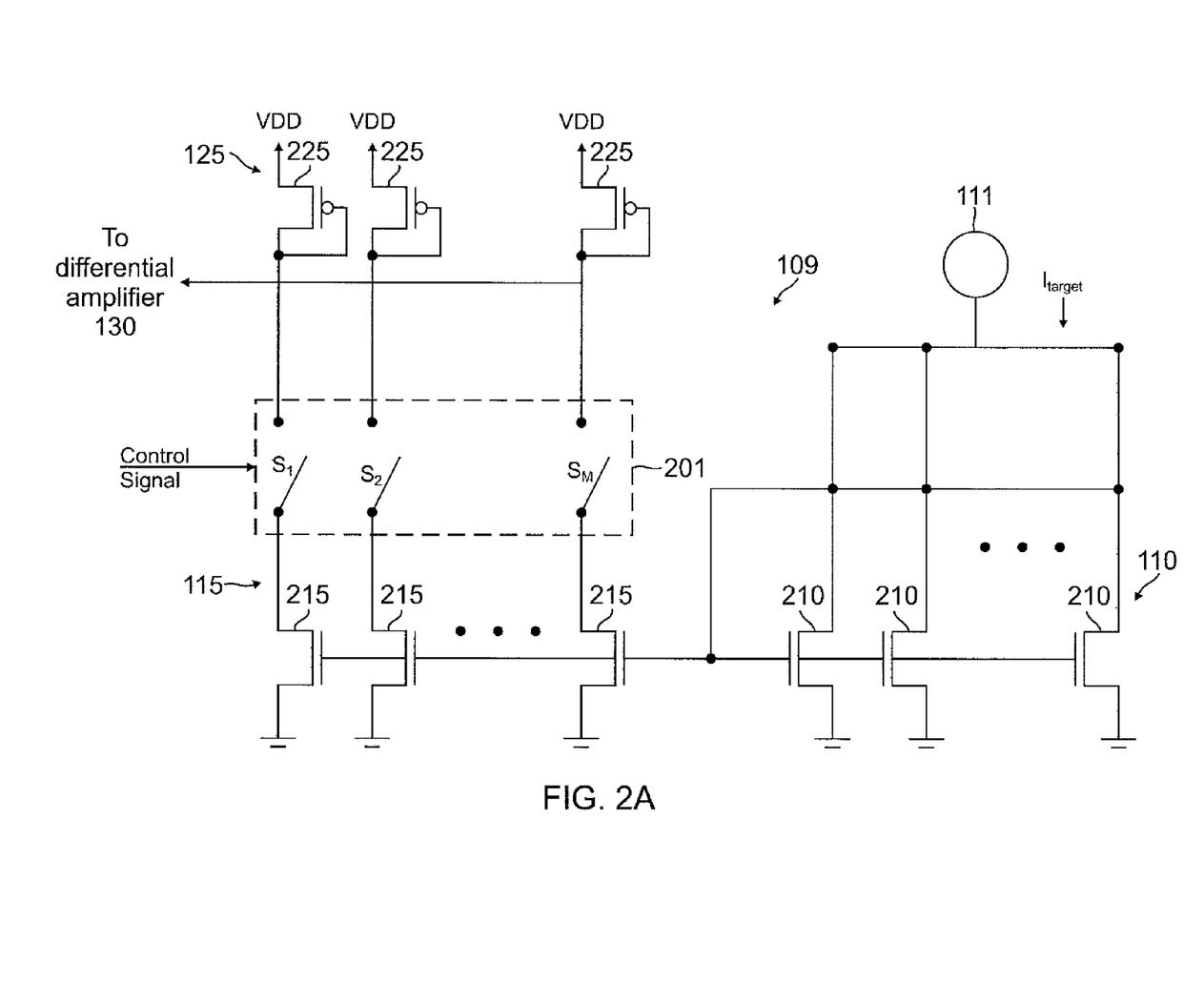
FIG. 2A illustrates an example array of transistors for instantiating the first current mirror in the collector current driver of FIG. 1.

To provide an ability to vary the current in first current path 120 (which as explained above is reflected in a substantially equal change in the collector current), each transistor 215 has its drain coupled to a corresponding switch from a switch array 201. In turn, load transistor 125 is instantiated using a parallel array of load transistors 225, where each switch couples to the power supply node carrying the power supply voltage VDD though a corresponding load transistor 225. Since there are M transistors 215, there are also M switches in array 201 ranging from a first switch $S_1$ to a last switch $S_M$. In addition, there are M load PMOS transistors 225. The switches are controlled by a control signal. For example, if each switch is implemented by a transistor (e.g., an NMOS transistor), then the control signal may be implemented as an M-bit control word, where each bit in the M-bit control word controls the gate of the corresponding switch transistor. Suppose the control signal is such that just $S_1$ is closed such that only the transistor 215 having its drain coupled to $S_1$. The remaining transistors 215 will not conduct any current since their corresponding switches are closed. The current mirrored into current path 120 would then equal 1/Mth the target current since transistors 210 and 215 are matched. Similarly, if all M switches were closed, then the current mirrored into current path 120 would equal the target current. In this fashion, the collector current can be varied from 1/Mth of the target current (or 2/Mth and so on) all the way to the target current itself. More generally, if N of the M switches are switched on, the current sunk into ground though the corresponding transistors 215 will be proportional to N/M of the target current.

Figure 2B:
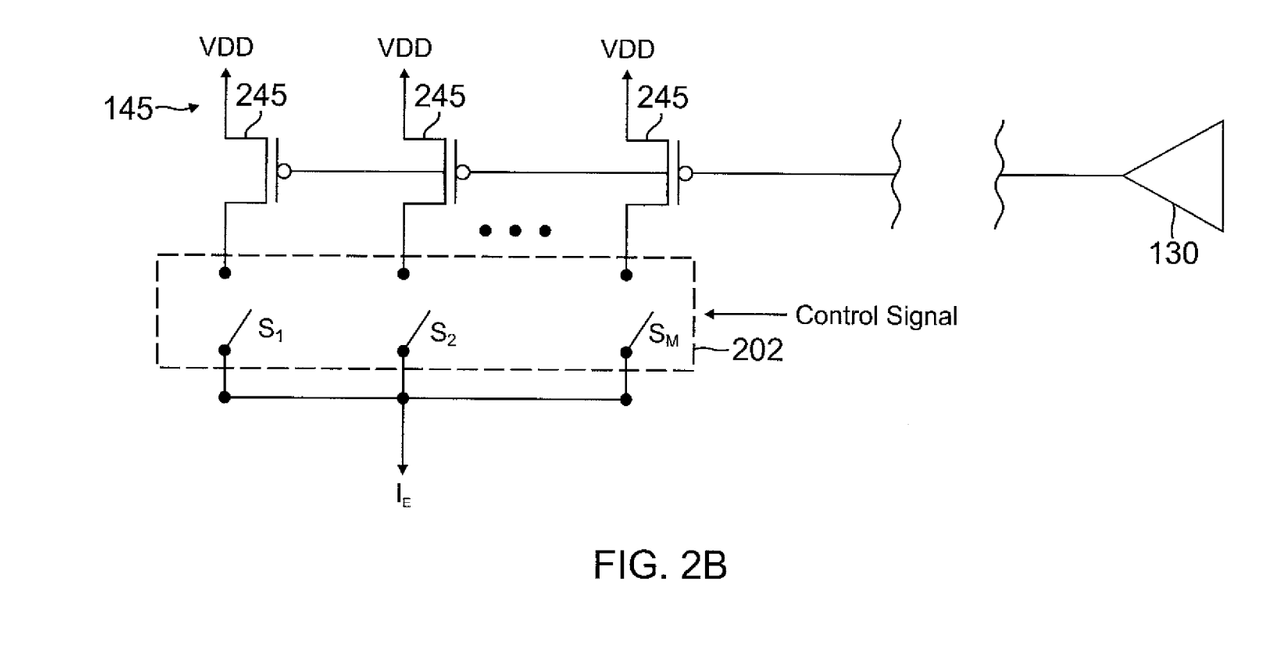
FIG. 2B illustrates an example array of transistors for instantiating the output transistor in the collector current driver of FIG. 1.

One option would be to merely implement first current mirror 109 as shown in is FIG. 2A but leave the remaining transistors in collector current driver 100 as fixed. But such an arrangement may again lead to less than optimal biasing of the various transistors in collector current driver 100 analogously as discussed above with regard to just varying current source 111. Transistors 145, 155, 150, 160, 170, 175, and 180 are replaced by corresponding parallel arrays of transistors. For example, FIG. 2B shows an instantiation for output transistor 145 using an array of PMOS transistors 245 coupled in parallel with regard to the power supply node. Each transistor 245 has its gate driven the negative feedback signal from differential amplifier 130 as described with regard to output transistor 145. The drain for each transistor 245 couples through a corresponding switch from a switch array 202. Referring again to FIG. 2A, if there are M transistors 215 used to implement transistor 115, then M transistors 245 would instantiate output transistor 145. There would thus be M switches in array 202 ranging from a switch $S_1$ to an Mth switch $S_M$. Each switch couples between a drain of its corresponding transistor 245 and the emitter terminal for transducer 105. The control signal discussed with regard to FIG. 2A may also control array 202. In this fashion, if the control signal is such that only one transistor 215 conducts, only one transistor 245 would conduct, and so on.

Figure 2C:
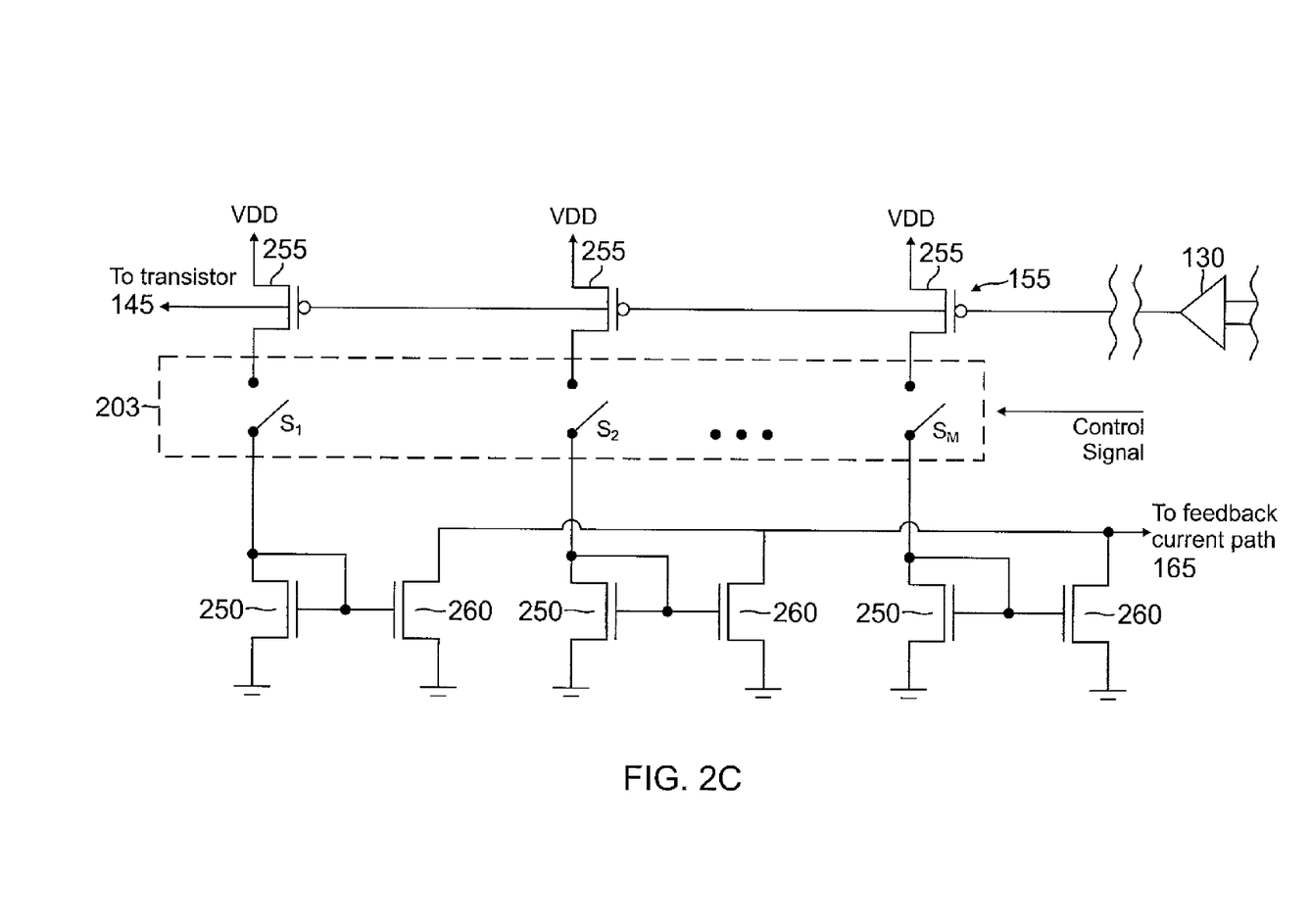
FIG. 2C illustrates an example array of transistors for instantiating the second current mirror in the collector current driver of FIG. 1.

Transistors 245 are matched to an array of PMOS transistors 255 used to instantiate first duplicate output transistor 155 in the second current mirror as shown in FIG. 2C. Transistors 255 couple in parallel between the power supply node and an array 203 of corresponding switches 203. If there are M transistors used to instantiate transistor 145 as discussed with regard to transistors 245, there would be M transistors 255 used to instantiate transistor 155 and M corresponding switches in array 203, ranging from a first switch $S_1$ to an Mth switch $S_M$. Similarly, sum current transistor 150 would be instantiated with M transistors 250 and mirror transistor 160 instantiated with M transistors 260. Each transistor 255 couples to a corresponding pair of transistors 250 and 260 as discussed with regard to transistors 155, 150, and 160 in FIG. 1. Thus, the drain of each transistor 260 will sink current from feedback current path 165 when each switch in array 203 is closed. Differential amplifier 130 drives the gates of transistors 255 as discussed in FIG. 1 with regard to first duplicate output transistor 155.

Figure 2D:
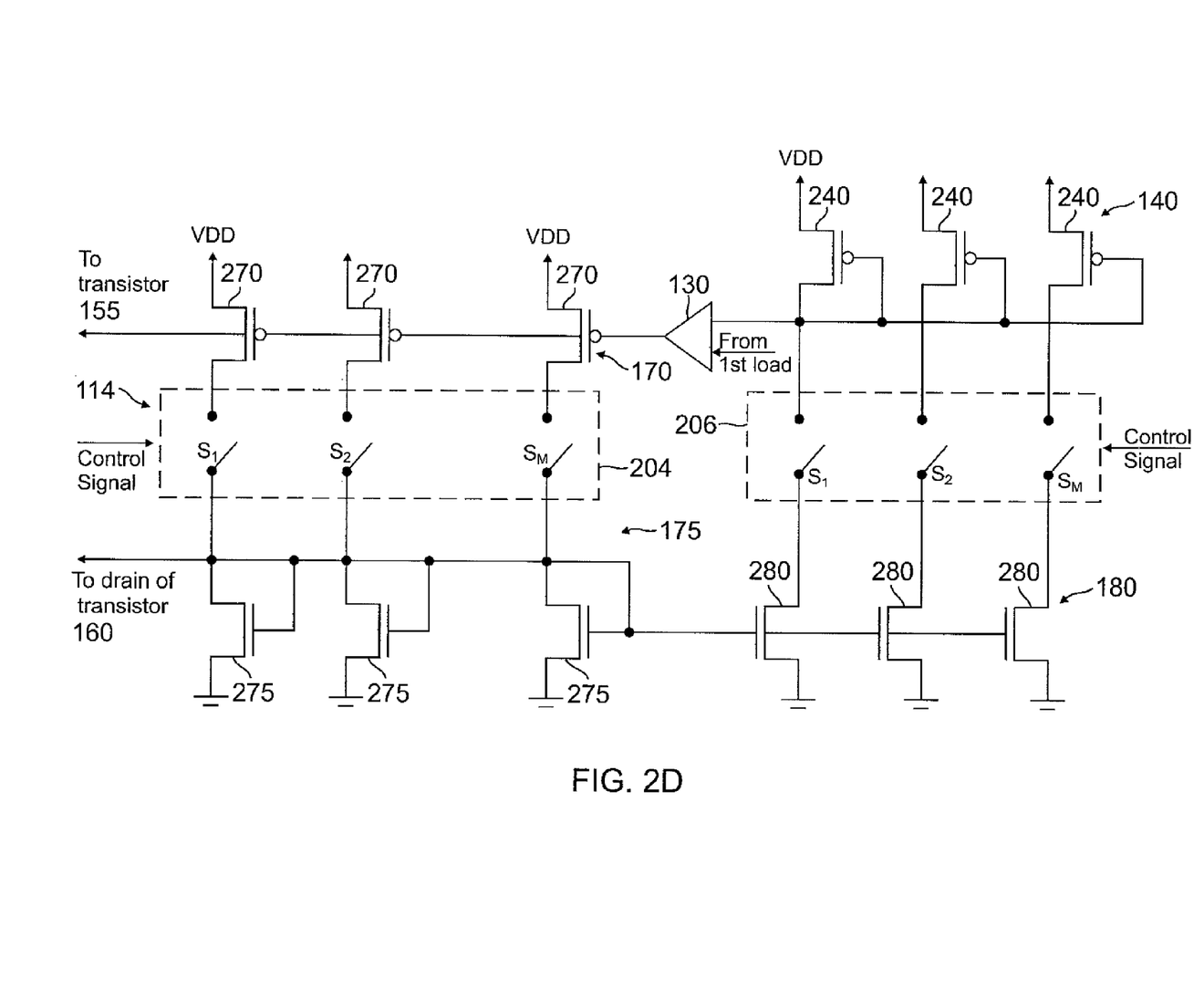
FIG. 2D illustrates an example array of transistors for instantiating the third current mirror in the collector current driver of FIG. 1.

Third current mirror 114 of collector current driver 100 may be instantiated as shown in FIG. 2D. Second duplicate output transistor 170 is instantiated using an array of M PMOS transistors 270 coupled in parallel between the power supply node and a corresponding array 204 of switches. Differential amplifier 130 drives the gates of transistors 270 as discussed with regard to second duplicate output transistor 170 of FIG. 1. Similarly, difference transistor 175 is instantiated using an array of M NMOS transistors 275. Each transistor 275 has its drain coupled through a corresponding one of the switches to the drain and gate of a corresponding one of transistors 275. The drains and gates transistors 275 couple to the gates of an array of NMOS transistors 280 that instantiate mirror transistor 180. The sources of transistors 280 all couple to ground whereas their drains couple to corresponding switches in a switch array 206. Similarly, second load transistor 140 is instantiated using M load PMOS transistors 240. Each transistor 270 is configured to be twice the size of each transistor 245 and 255. Alternative transistor arrays may be used. Regardless of the particular array and switch combination, instantiating each transistor using an array of M transistors and corresponding switches is quite advantageous because the resulting collector current is immune to variations in the transducer. Moreover, the transistors in collector current driver 100 are then readily biased for the varying currents used to generate the necessary collector current ratios.

Figure 3:
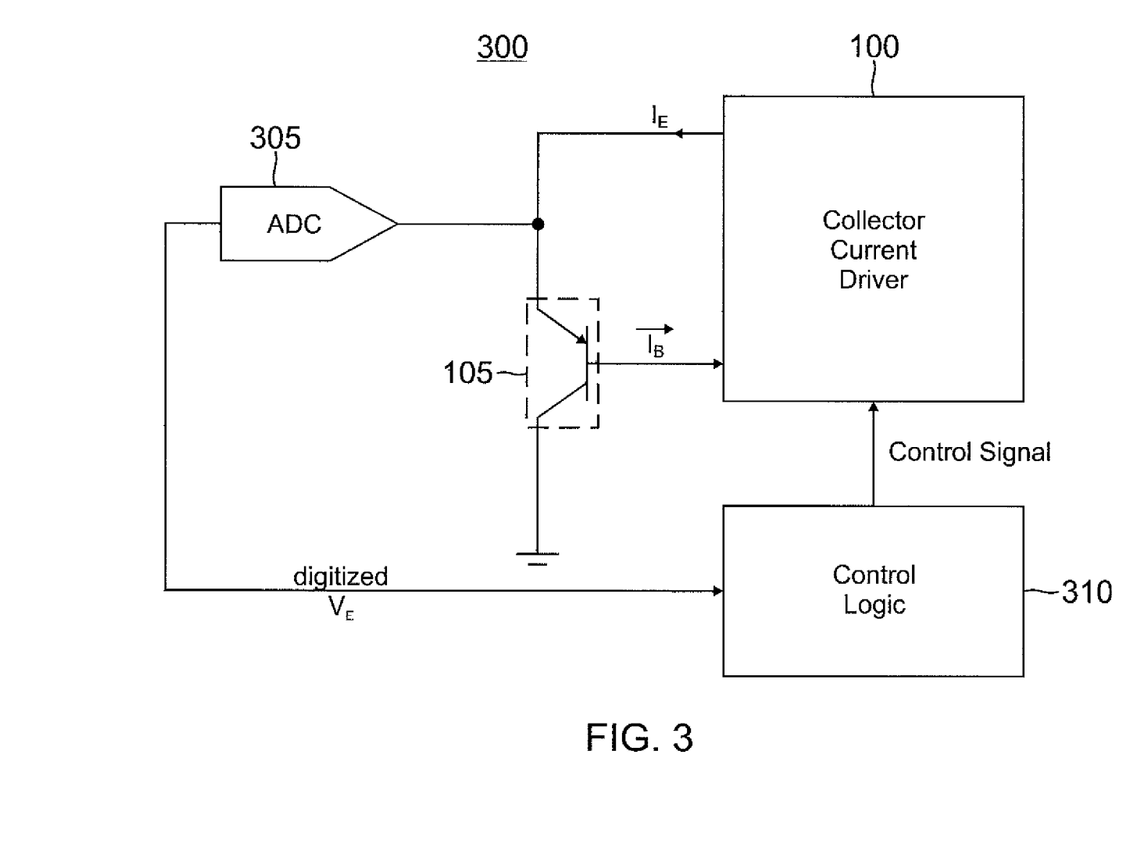
FIG. 3 illustrates a system incorporating the collector current driver of FIG. 1 and a plurality of transistor arrays such as the one shown in FIG. 2.

Referring now to FIG. 3, a system 300 includes a collector current driver 100 configured to be responsive to a control signal as discussed with regard to the switches for transistor array 215. Collector current driver 100 controls the collector current for transducer 105 as discussed above. An analog-to-digital converter (ADC) 305 digitizes the resulting emitter voltage for transducer 105 and provides the resulting digitized value to a control logic circuit 310. Control logic circuit 310 also controls the switch arrays for the transistors 115, 145, 155, 170, 150. For example, control logic circuit 310 could control the control signal such that a first collector current is driven out of transducer 105. Control logic circuit 310 may then change the control signal such that a second collector current is driven out of transducer 105, where the second collector current has a known relationship to the first collector current through the use of the transistor arrays discussed above. For example, the second collector current may be M times the first collector current using the arrays of M transistors discussed above. The ratio of the second collector current to the first collector current would then equal M. Control logic circuit 310 may be configured to store the logarithm of M accordingly. A temperature measurement would then be performed by control logic circuit 310 by processing a difference of the emitter voltages for the two emitter current values as obtained through ADC 305 with the appropriate proportionality factors and the stored logarithm value.

An example method of operation for a collector current driver will now be discussed.

Example Method of Operation

Figure 4:
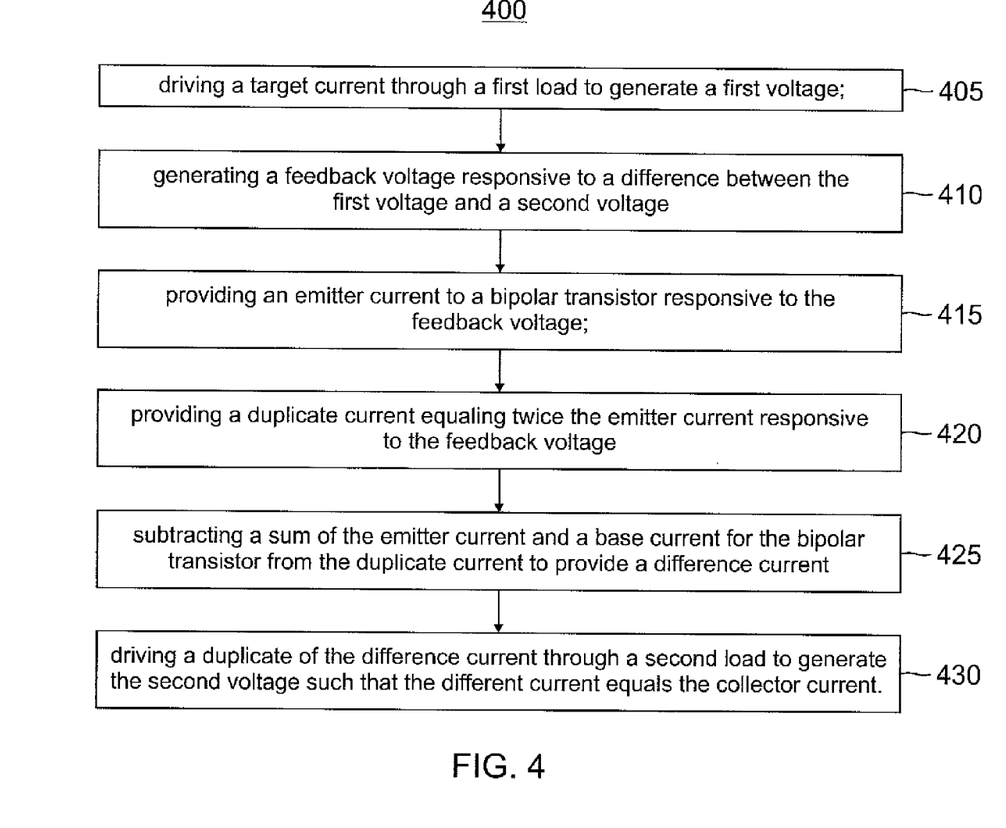
FIG. 4 is a flowchart for an example method of operation for the collector current driver of FIG. 1.

As shown in the flowchart of FIG. 4, a method of operation 400 includes an act 405 of driving a target current through a first load to generate a first voltage. An example of this act is the current source 111 of collector current driver 100 driving first current mirror 109 comprising transistors 110 and 115 to generate a first voltage at the drain of transistor 125. Method 400 continues with an act 410 of generating a feedback voltage responsive to a difference between the first voltage and a second voltage. Such an act is performed, for example, by differential amplifier 130 generating a feedback voltage responsive to the drain voltages on load transistors 140 and 125. Method 400 also includes an act 415 of providing an emitter current to a bipolar transistor responsive to the feedback voltage. For example, output transistor 145 provides such an emitter current as discussed with regard to FIG. 1. In addition, method 400 includes an act 420 of providing a duplicate current equaling twice the emitter current responsive to the feedback voltage such as discussed with regard to second duplicate output transistor 170 of FIG. 1. Method 400 also includes an act 425 of subtracting a sum of the emitter current and a base current for the bipolar transistor from the duplicate current to provide a difference current such as discussed with regard to the splitting of the current in feedback current path 165 between mirror transistor 160 and difference transistor 175 in collector current driver 100. Finally, method 400 includes an act 430 of driving a duplicate of the difference current through a second load to generate the second voltage such that the difference current equals the collector current such as discussed with regard to driving the current through second current path 135 in collector current driver 100.

It will be appreciated that the techniques and concepts discussed herein are not limited to the specific disclosed embodiments. The appended claims encompass all such changes and modifications as fall within the true spirit and scope of this invention.

I claim:
1. A circuit, comprising:
a current source configured to source a target current;

a differential amplifier configured to compare the target current to a duplicate difference current to generate a feedback voltage;

an output transistor responsive to the feedback voltage and configured to source an emitter current to a bipolar transistor;

a difference circuit configured to subtract a sum current equaling a sum of the emitter current and a base current for the bipolar transistor from a first current equaling twice the emitter current to produce a difference current; and a difference current mirror configured to duplicate the difference current to provide the duplicate difference current.

2. The circuit of claim 1, further comprising:
a first load; and
a second load, wherein the differential amplifier is configured to compare the target current to the duplicate difference current responsive to voltages developed at a terminal for each of the first and second loads.

3. The circuit of claim 2, further comprising:
a first current path coupled to the first load;
a second current path coupled to the second load; and
a target current mirror configured to duplicate the target current into a duplicate target current driven through the second current path, wherein the current source is configured to drive the target current through the first current path.

4. The circuit of claim 1, further comprising:
a duplicate output transistor matched to the output transistor, wherein the duplicate output transistor is configured to drive a summing current mirror with a duplicate of the emitter current responsive to the feedback voltage.

5. The circuit of claim 4, wherein the summing current mirror is further configured to receive the base current to provide the sum current and to duplicate the sum current to provide a duplicate sum current, and wherein the difference circuit is further configured to subtract the sum current from the first current using the duplicate sum current.

6. The circuit of claim 1, further comprising:
a duplicate output transistor configured to provide the first current responsive to the feedback voltage, wherein the duplicate output transistor is further configured to drive the first current to the difference circuit through a feedback current path.

7. The circuit of claim 6, wherein the difference circuit comprises a first transistor coupled to the feedback current path and a second transistor coupled to the feedback current path, and wherein the first transistor is configured to sink the duplicate sum current into ground, and wherein the second transistor is configured to sink the difference current into ground.

8. The circuit of claim 6, wherein the output transistor and the duplicate output transistor both comprise PMOS transistors.

9. The circuit of claim 6, wherein the duplicate output transistor comprises a single transistor of twice a size for the output transistor.

10. The circuit of claim 6, wherein the output transistor and the duplicate output transistor each has a source coupled to a power supply node.

11. A method, comprising:
driving a target current through a first load to generate a first voltage;
generating a feedback voltage responsive to a difference between the first voltage and a second voltage;
driving an emitter current into a bipolar transistor responsive to the feedback voltage;
providing a duplicate current equaling twice the emitter current responsive to the feedback voltage;
subtracting a sum of the emitter current and a base current for the bipolar transistor from the duplicate current to provide a difference current; and
driving a duplicate of the difference current through a second load to generate the second voltage such that the difference current equals the collector current.

12. The method of claim 11, wherein driving the emitter current comprising driving a gate of an output transistor with the feedback voltage to drive the emitter current from the output transistor to an emitter terminal for the bipolar transistor.

13. The method of claim 11, further comprising driving the target current into a first current mirror to generate the first voltage.

14. The method of claim 13, wherein driving the target current into a first current mirror to generate the first voltage comprises:
driving the target current into an array of M first transistors arranged in parallel, M being an integer greater than one; and
for an array of M first current paths, selecting N of the first current paths to conduct responsive to a control signal such that a mirrored current flows in the subset of the first current paths proportional to a ratio N/M, wherein N is a positive integer less than M.

15. The method of claim 14, wherein selecting N of the first current paths comprises turning on a switch in each of the selected first current paths responsive to the control signal.

16. A circuit comprising:
a current source for providing a target collector current for a bipolar transistor;
a first current mirror for providing a mirror current equal to the bipolar transistor's collector current ($I_C$); and
a differential amplifier for generating a feedback voltage responsive to a difference between the target collector current and the mirror current,
wherein the feedback voltage is adapted to vary the emitter current ($I_E$) provided to the bipolar transistor for maintaining the bipolar transistor's collector current equal to the target collector current.

17. The circuit of claim 16 including switches for varying the target collector current.

18. The circuit of claim 16 including a first output transistor for providing the emitter current to the bipolar transistor, wherein the differential amplifier is coupled to the gate of the output transistor for applying the feedback voltage to the gate.

19. The circuit of claim 16 including a second current mirror for providing a sum current equal to the sum of the base and emitter currents ($I_B+I_E$) of the bipolar transistor, wherein:
the first current mirror is adapted to receive a duplicate current equal to twice the bipolar transistor's emitter current ($2I_E$); and
the second current mirror is adapted to subtract the sum current ($I_B+I_E$) from the duplicate current ($2I_E$) to provide the bipolar transistor's collector current ($I_C$) as the current mirrored by the first current mirror.

20. The circuit of claim 19 including:
a first output transistor for providing the emitter current ($I_E$) to the bipolar transistor;

a second output transistor for providing a duplicate current equal to the bipolar transistor's emitter current ($I_E$) to the second current mirror; and a third output transistor for providing the duplicate current equal to twice the bipolar transistor's emitter current ($2I_E$) to the first current mirror, wherein the differential amplifier is coupled to the gates of the first, second, and third output transistors for applying the feedback voltage to the gates.

* * * * *